United States Patent

Bhandarkar et al.

[11] Patent Number: 5,967,577
[45] Date of Patent: Oct. 19, 1999

[54] APPARATUS FOR DISPENSING FLUID IN AN ARRAY PATTERN

[75] Inventors: Sarvotham M. Bhandarkar; Kishore Kumar Chakravorty; Tai Chong Chai; Jian Hua Wu, all of Singapore, Singapore

[73] Assignee: Institute of Microelectronics, Singapore, Singapore

[21] Appl. No.: 09/146,465

[22] Filed: Sep. 3, 1998

Related U.S. Application Data

[62] Division of application No. 08/582,746, Jan. 4, 1996, Pat. No. 5,836,520.

[30] Foreign Application Priority Data

Oct. 28, 1995 [SG] Singapore .......................... 9501664-8

[51] Int. Cl.[6] .................................................. B25J 15/06
[52] U.S. Cl. .......................................................... 294/64.1
[58] Field of Search ................................ 294/64.1, 64.3, 294/65; 239/590.3, 590.5, 553.5; 269/21; 279/3; 248/362, 363

[56] References Cited

U.S. PATENT DOCUMENTS

| | | |
|---|---|---|
| 3,404,845 | 10/1968 | Schmeling et al. .............. 239/553.5 X |
| 4,049,484 | 9/1977 | Priest et al. ......................... 294/64.1 X |
| 4,787,290 | 11/1988 | Okumo .............................. 239/553.5 X |
| 5,243,841 | 9/1993 | Fleissner .......................... 239/553.5 X |
| 5,284,287 | 2/1994 | Wilson et al. ...................... 294/64.1 X |
| 5,516,125 | 5/1996 | McKenna ............................ 294/64.1 X |
| 5,749,614 | 5/1998 | Reid et al. .............................. 294/64.1 |

*Primary Examiner*—Johnny D. Cherry
*Attorney, Agent, or Firm*—Proskauer Rose LLP

[57] ABSTRACT

A dispenser contains a chamber enclosed by an upper wall and a lower wall, both walls are oriented parallel to each other. The upper wall has a vertically bored inlet port and the lower wall has a plurality of vertically bored outlet ports for providing access to the chamber. The outlet ports are geometrically arranged in an array pattern characterized by equidistantly spaced rows and columns of bores. There is a plurality of baffle plates interposed between the upper wall and the lower wall. The baffle plates, which are spatially separated from each other, are oriented parallel to and spatially separated from the upper and lower walls. The baffle plates have a plurality of vertically bored holes for providing access between the inlet port and the outlet ports, whereby the dispenser is effective in providing homogeneous flow of fluid through the outlet ports.

8 Claims, 5 Drawing Sheets

APPARATUS FOR DISPENSING FLUID IN AN ARRAY PATTERN

This application is a Divisional of Application No. 08/582,746, filed Jan. 4, 1996, now U.S. Pat. No. 5,836,520.

RELATED APPLICATION

The subject matter of the present application is related to the subject matter of U.S. patent application Ser. No. 08/582,745, entitled "Highly Reliable And Planar Ball Grid Array Package", filed on Jan. 4, 1996, for Kishore Kumar CHAKRAVORTY and Thiam Beng LIM. Both this application and the above-noted related application are assigned to the same assignee. The contents of the above-noted related application are incorporated herein by reference.

FIELD OF THE INVENTION

This invention relates to a dispenser used for example, in the manufacture of electronic packaging for Integrated Circuits (ICs) in general, and more particularly, to a dispenser used for dispensing fluid in an array pattern. The dispenser may be used as a shower head to dispense epoxy or to pick up and place solder balls.

BACKGROUND OF THE INVENTION

An integrated circuit or chip must have input/output (I/O) connections in order to function as an electronic circuit. Many of these chips require more than 200 I/O connections. For these high count chips, it has been shown advantageous to bring out the I/O connections to land sites arranged in an array pattern on the bottom face of the substrate. Solder balls are attached to these land sites. These solder balls, in turn, provide the I/O connections external to the chip. (IC packages utilizing such solder balls are described in the above-identified related application.)

A technique in which the solder balls are placed on the land sites is well known in the art. FIG. 1 shows a schematic cross sectional view of one such prior art apparatus. Only the dispensing portion 10 of the apparatus is shown. As shown, the dispensing portion 10 has a small chamber 14 which has an upper horizontal wall 13 and a lower horizontal wall 15. The upper wall 13 has an inlet port 12 which permits a positive or negative pressure to be applied to chamber 14. The lower wall 15 has an array of outlet ports 16 bored therethrough. In the example shown in FIG. 2, which is a cross sectional view of the dispenser portion 10 along line 2—2 shown in FIG. 1, the lower wall 15 has a 15×15 array pattern of 15 rows and 15 columns of outlet ports, or a total of 225 outlet ports.

In operation, the dispensing portion 10 is placed into a source of solder balls. Generally, the solder balls are of equal size. A negative air pressure is then applied at inlet port 12, thereby creating a partial vacuum within the chamber 14 and suction forces at the outlet ports 16. Due to the suction forces, solder balls (not shown) attach themselves to the outlet ports 16. In the ideal situation, one solder ball should be attached to every outlet port 16 without being jammed into the ports 16.

The dispensing portion 10 is then placed immediately above and aligned with the land sites of the substrate. A positive air pressure is then applied at inlet port 12, thereby releasing the solder balls from the outlet ports and depositing them onto the land sites. Again in the ideal situation, one solder ball should be released from each outlet port 16.

The dispensing portion 10, however, has several shortcomings. The flow of air in the chamber 14 is not uniform during either transient or steady state periods of pressure applications at the inlet port 12. This is due to the directionality of air flow in the chamber 14, where more air tends to pass at locations near the inlet port 12 and less air passes at locations remote from the inlet port 12.

In fact, if one was to examine the pressure within the chamber 14, it would be seen that a pressure gradient exists across the lower wall 15 of the chamber 14. The maximum pressure magnitude would be found at the outlet ports 16 located adjacent to the inlet port 12. The pressure magnitude drops away sharply as one moves toward the outlet ports 16 located furthest away from the inlet port. Furthermore, the air flow velocity is at a maximum through the outlet ports 16 adjacent to the inlet port 12 and at a minimum through the outlet ports 16 remotely located from the inlet port 12.

Due to the aforementioned pressure gradient, there is incomplete pick up and release of solder balls. During the pick up cycle, when negative pressure is applied to the inlet port 12, the vacuum created within the remote outlet ports may be too weak to pick up the solder balls. If the inlet vacuum pressure is increased, the solder balls at the adjacent outlet ports may become jammed within the outlet ports. This, in turn, creates difficulties during the solder ball release cycle.

What has been described thus far is the undesirable effect created when the dispensing portion 10 is used to pick up and place solder balls. It is also possible to use the dispensing portion 10 as an epoxy dispenser for attaching a die to a substrate and it has been used as such. In the latter case, epoxy fluid is transmitted into the chamber 14 by way of the inlet port 12 and out of the chamber 14 by way of the outlet ports 16.

It will be understood that the undesirable effects aforementioned with respect to air flow within chamber 14 are also applicable when the device is used as an epoxy dispenser.

It is, therefore, an object of the present invention to overcome the disadvantages and limitations of prior apparatus by providing a new and improved dispenser.

Another object of this invention is to provide an apparatus for uniformly picking up and depositing solder balls by eliminating the pressure gradients at the lower wall of the chamber.

Yet another object of this invention is to provide an apparatus for uniformly depositing epoxy onto a substrate.

SUMMARY OF THE INVENTION

In an illustrative embodiment of the invention, a dispenser contains a chamber enclosed by an upper wall and a lower wall. The walls are oriented parallel to each other. The upper wall has a vertically bored inlet port and the lower wall has a plurality of vertically bored outlet ports for providing access to the chamber. The outlet ports are geometrically arranged in an array pattern characterized by equidistantly spaced rows and columns of bores. There is a plurality of baffle plates interposed between the upper wall and the lower wall. The baffle plates, which are spatially separated from each other, are oriented parallel to and spatially separated from the upper and lower walls. The baffle plates have a plurality of vertically bored holes for providing access between the inlet port and the outlet ports, whereby the dispenser is effective in providing homogeneous flow of fluid through the outlet ports.

DETAILED DESCRIPTION OF THE DRAWINGS

Figure 1:
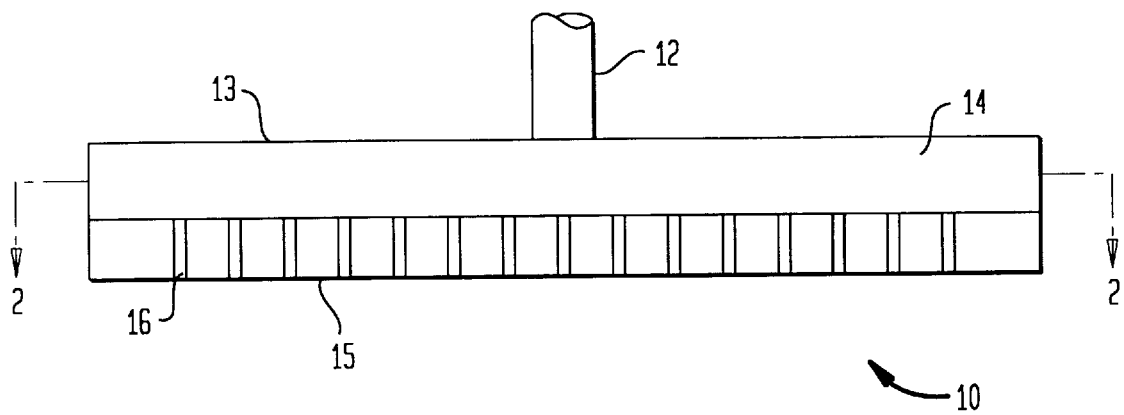
FIG. 1 is a schematic cross sectional view of the dispenser portion of a prior apparatus for dispensing fluid in an array pattern.
Figure 2:
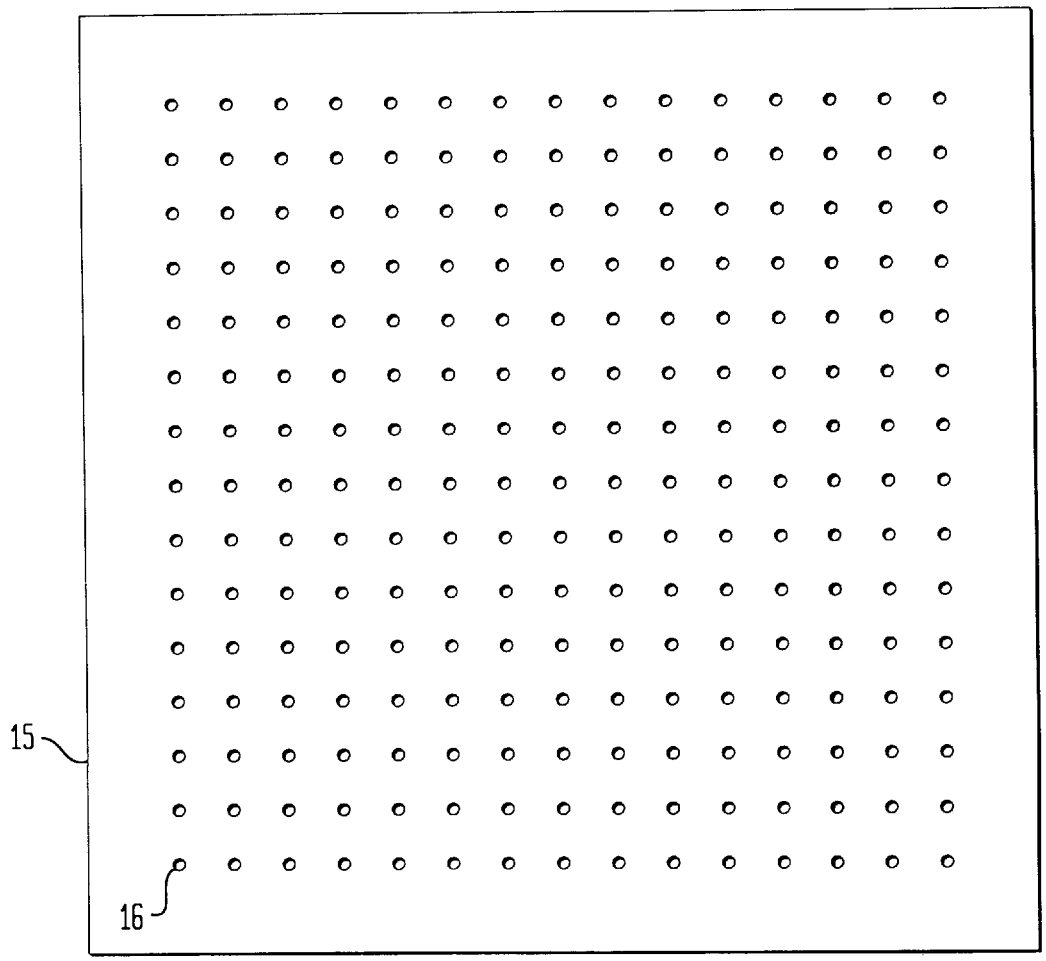
FIG. 2 is a cross sectional view of the dispenser portion along line 2—2 of FIG. 1 showing a typical array pattern of bores.

FIGS. 1 and 2 have been described in the background section of this application.

Figure 3:
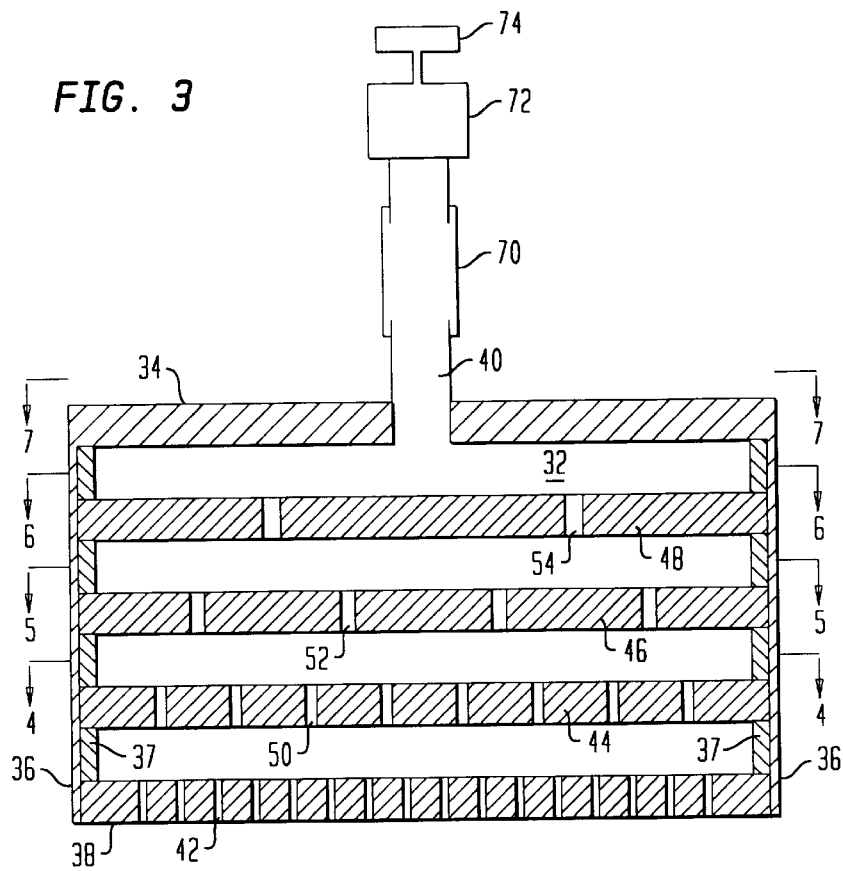
FIG. 3 is a schematic cross sectional view of the dispenser portion of an apparatus forming the basis of this invention.
Figure 7:
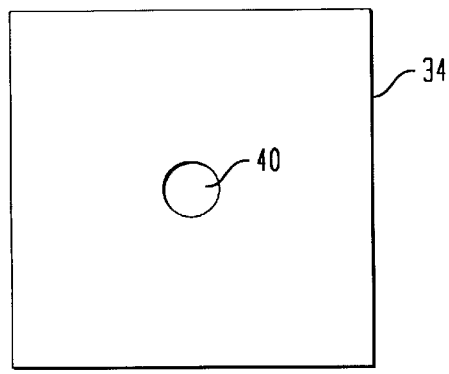
FIG. 7 is a cross sectional view of the dispenser portion along line 7—7 of FIG. 3.

Referring now to FIG. 3, there is shown a cross section of a dispenser portion 30 for dispensing fluid in an array pattern according to this invention. The dispenser portion 30 includes an enclosed chamber 32, which is formed by an upper horizontal wall 34, a lower horizontal wall 38 and sidewalls 36. The upper wall 34 is parallel to the lower wall 38. The upper wall 34 has bored therethrough one inlet port 40 to provide access into the upper portion of chamber 32. As can be seen from FIG. 7, the inlet port 40 is centrally located on the upper wall 34. The lower wall 38 has bored therethrough multiple outlet ports 42 to provide access into the lower portion of the chamber 32.

It will be understood that the outlet ports 42 are arranged in an array pattern similar to that shown in FIG. 2. Illustratively, there is a 16×16 array as shown in FIG. 2.

Interposed between the upper wall 34 and the lower wall 38 are three baffle plates; a first baffle plate 44, a second baffle plate 46 and a third baffle plate 48. As will be explained later, the baffle plates are effective in controlling fluid flow within chamber 32. The baffle plates are spaced apart from each other and from the upper wall 34 and lower wall 38 by vertical spacers 37. In this manner, the baffle plates are effectively maintained in spatial planes which are parallel to each other and to the upper and lower walls.

Figure 4:
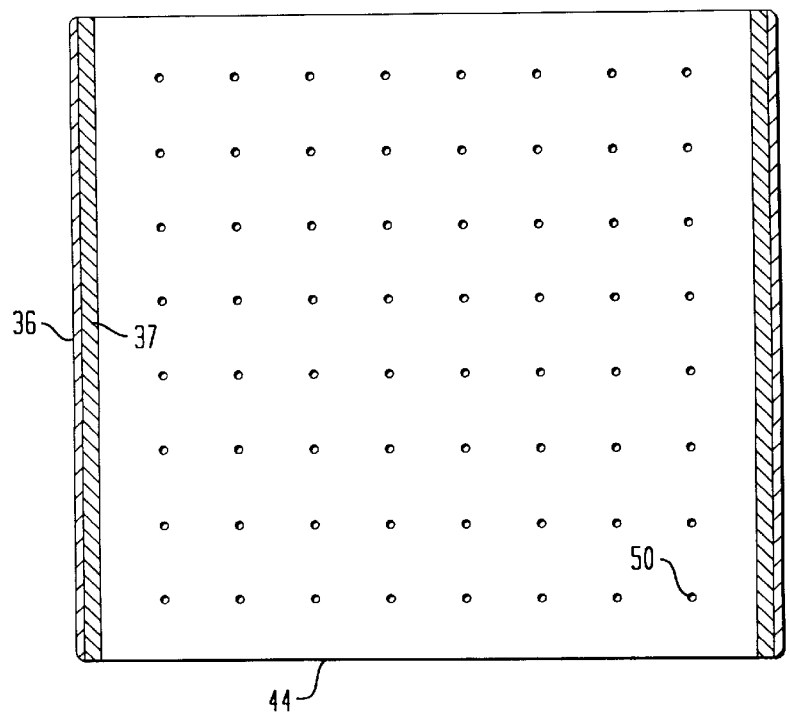
FIG. 4 is a cross sectional view of the dispenser portion along line 4—4 of FIG. 3.
Figure 5:
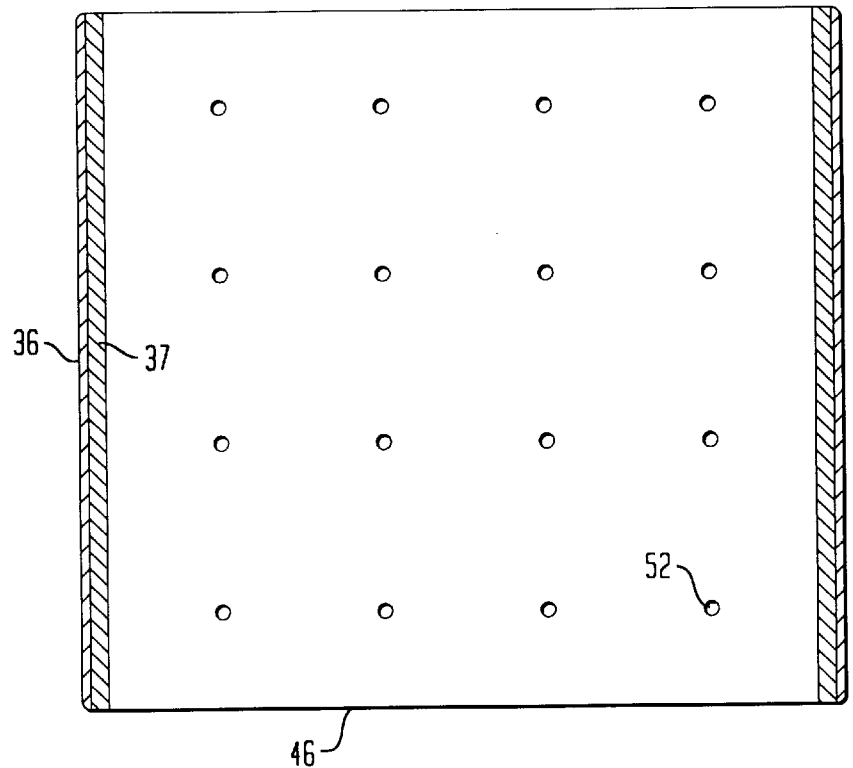
FIG. 5 is a cross sectional view of the dispenser portion along line 5—5 of FIG. 3.
Figure 6:
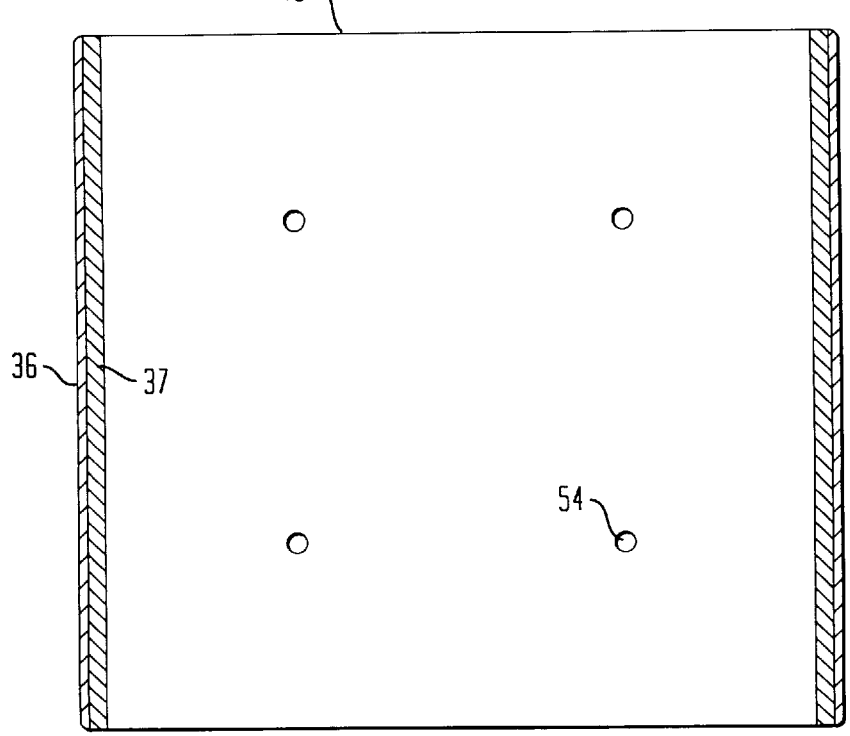
FIG. 6 is a cross sectional view of the dispenser portion along line 6—6 of FIG. 3.

Referring next to FIGS. 4, 5 and 6, there are shown the first baffle plate 44, the second baffle plate 46 and the third baffle plate 48, respectively. As can be seen, the first baffle plate 44 has an 8×8 array of holes 50 which are each bored vertically therethrough. Similarly, the second baffle plate 46 and the third baffle plate 48 have a 4×4 array of vertical holes 52 and a 2×2 array of vertical holes 54, respectively. The array patterns are symmetrical. Thus, the first baffle plate 44 has an array consisting of 8 rows and 8 columns of holes, or a total of 64 holes. The second baffle plate 46 has an array of 4 rows and 4 columns of holes for a total of 16 holes and, finally, the third baffle plate 48 has an array of 2 rows and 2 columns of holes for a total of 4 holes. Since a cross section is shown in FIG. 3, the first baffle plate 44 will be seen to have 8 holes, the second baffle plate 46 is shown with 4 holes and the third baffle plate 48 is shown with 2 holes.

The dimensions of the holes will now be explained. It will be understood that the outlet ports 42 each have a bore diameter size that is suitable for the particular use of the dispenser 30. When used to pick up and place solder balls, the bore diameter of each port 42 must be slightly smaller than the diameter of the solder ball. When used as an epoxy dispenser, the bore diameter may be different. The designed size will, of course, vary with the viscosity and other characteristics of the epoxy fluid. The table below shows typical diameter sizes for outlet ports 42.

After the diameter of outlet ports 42 has been selected, the bore diameters of holes 50, holes 52 and holes 54 may be determined. It has been found that the holes may be made progressively larger, as the baffle plate is placed further away from outlet ports 42. Thus, holes 50 spatially located immediately above the outlet ports may be made slightly larger in diameter than the diameter of outlet ports 42. In turn, holes 52, being located above holes 50 and further from the outlet ports, may be made slightly larger in diameter than that of holes 50. Finally, holes 54, which are furthest away, may be made slightly larger than holes 52. Typical bore diameter sizes are shown in the table below.

| | Typical Bore Diameter (mm) |
|---|---|
| Outlet Ports 42: | 0.4 |
| First Baffle Plate Holes 50: | 0.4 |
| Second Baffle Plate Holes 52: | 1.0 |
| Third Baffle Plate Holes 54: | 2.0 |
| Inlet Port 40: | 2.0 |

The upper and lower walls 34 and 38 are 40 mm×40 mm and have a thickness of 4 mm. Each baffle 44, 46, 48 is 40 mm×40 mm and has a thickness of 1 mm. The separation distance between baffles between upper baffle 48 and upper wall 34 is 3 mm. The separation distance between the lower baffle 44 and lower wall 38 is 3 mm. The walls and baffles are formed from aluminum.

Figure 8:
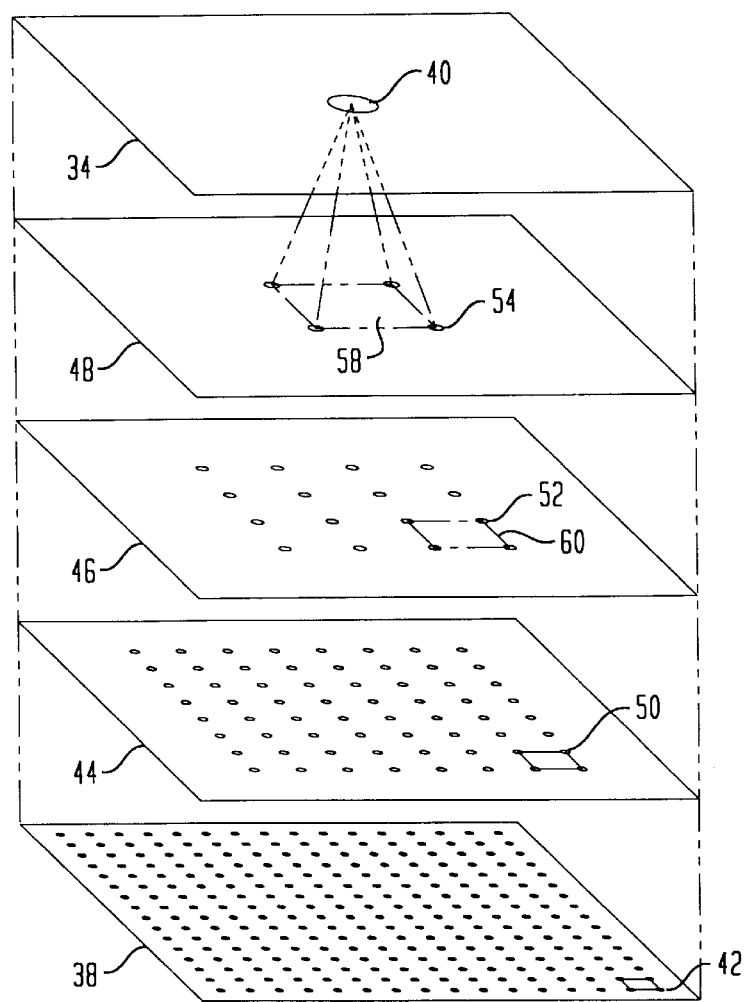
FIG. 8 is an isometric pictorial illustrating the geometrical relationship amongst the many bores shown in FIG. 3.

The arrangement of the bores will now be explained by reference to FIG. 8. In the explanation that follows "bores" are referred generically to holes in surfaces that are baffle plates or inlet and outlet ports in the upper and lower wall surfaces, respectively. In general, each bore in a surface positioned above a lower surface is symmetrically placed with respect to four adjacent bores that have geometrically formed a square on the lower surface. Thus, the inlet port 40, which is bored through the center of the upper wall 34, is also positioned directly above the center of a square 58 formed by four adjacent holes 54 in the baffle plate 48. Similarly, each one of the four holes 54 is positioned directly above the centers of four squares 60 formed by the sixteen holes 52.

Continuing in this manner, each one of the sixteen holes 52 is positioned directly above the centers of the sixteen squares (not shown) formed by the sixty four holes 50 in baffle plate 44. Finally, each one of the sixty four holes 50 is positioned directly above the centers of the sixty four squares (not shown) formed by 256 outlet ports 42.

In the embodiment shown in FIG. 3, there is an even number of rows and columns of outlet ports, forming a 16×16 array pattern. Consequently, 64 squares can be formed from the 16×16 array to determine the location of the 64 holes in baffle plate 44. Next, 16 squares can be formed with the 64 holes of the first baffle plate to determine the location of the 16 holes in the second baffle plate. Finally, four squares can be formed with the 16 holes of the second baffle plate to determine the location of the four holes in the third baffle plate.

Figure 9:
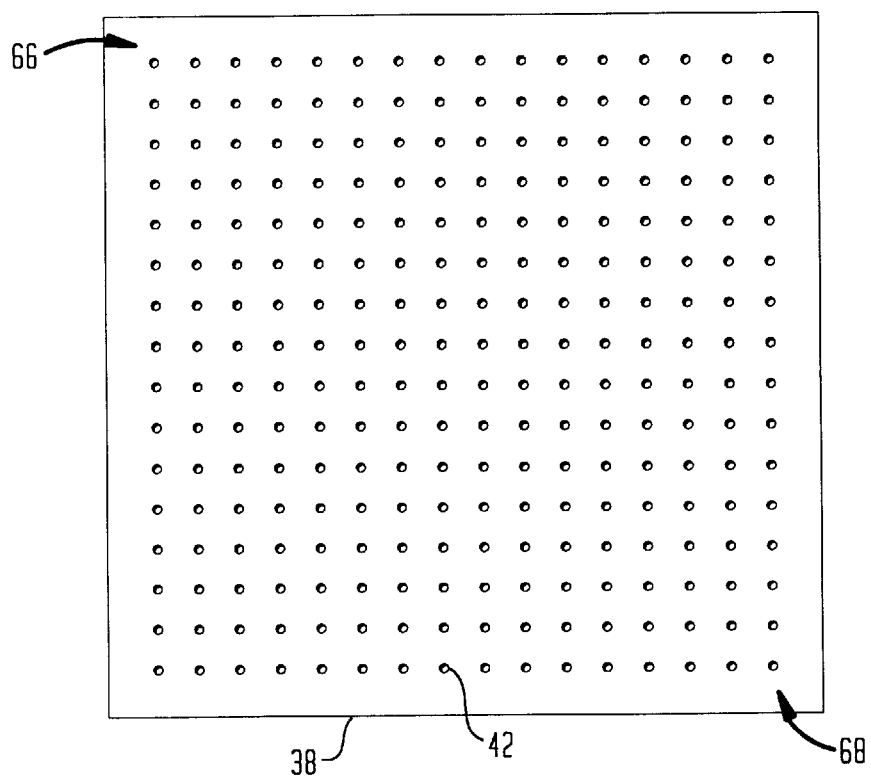
FIG. 9 is a cross sectional view of a lower wall of dispenser portion having phantom bores.

When there is an odd number of rows and columns of outlet ports desired, for example a 15×15 array, as shown in FIG. 2, the design sequence for the bore arrangements may, nevertheless, proceed in the manner described above by adding a phantom row and a phantom column of outlet ports. In other words, the designer may assume that there is 16 rows and 16 columns of bores in the array pattern, wherein 15 rows and 15 columns contain real bores but one end row and one end column contain phantom bores. FIG. 9 shows an array pattern having 16 rows and 16 columns of bores which comprises 15 rows and 15 columns of real bores and $16^{th}$ row 66 and column 68 of phantom bores. With this procedure of adding phantom bores, the three baffle plates would appear similar to the arrangement shown in FIG. 3.

Having described the arrangement of the bores, the improved air (or other fluid) flow in chamber 32 will now be described.

As shown in FIG. 3, the inlet port 40 is removably coupled by way of a conduit 70 to a source of fluid 72, such as a compressed air container or an epoxy container. Controls 74 are also provided at the container site to regulate the pressure of the fluid. When a positive pressure is applied by the controls 74, fluid will flow from the container 72 into chamber 32 by way of the inlet port 40. When a negative pressure is applied, fluid will flow in the opposite direction, namely, out of the chamber 32 and into the container 72. By varying the amount of positive or negative pressure, the fluid velocity may be increased or decreased. This, in turn, regulates the fluid velocity at outlet ports 42.

As mentioned earlier, it is desirable that no pressure gradient exists across the lower wall 38 of the chamber 32. In the embodiment shown in FIG. 3, homogeneous pressure is achieved across the lower wall surface 38 and, consequently, fluid velocity in everyone of the numerous outlet ports 42 is the same. Thus, the dispenser 30 is effective in dispensing equal amounts of fluid through outlet ports 42.

When used as a tool to pick and place solder balls, the dispenser 30 is effective in picking up and depositing solder balls of equal size at every outlet port 42. This is due to the uniform positive or negative air pressure that is created across the lower wall 38 of the chamber 32. Since the pressure is uniform, the amount of pressure can be effectively controlled until the desired solder ball size is uniformly picked up and uniformly deposited.

The uniformity of pressure results from the baffle plates 44, 46, 48 shown in FIG. 3. Each baffle plate redirects the fluid flow between the inlet port 40 and outlet ports 42. Furthermore, by having geometrically arranged baffle holes 50, 52, 54 in the manner described earlier, the paths taken by the fluid are equal in length. This is shown schematically in FIG. 10 with two paths of fluid flow. While many paths exist, only path 62 and path 64 are shown.

Figure 10:
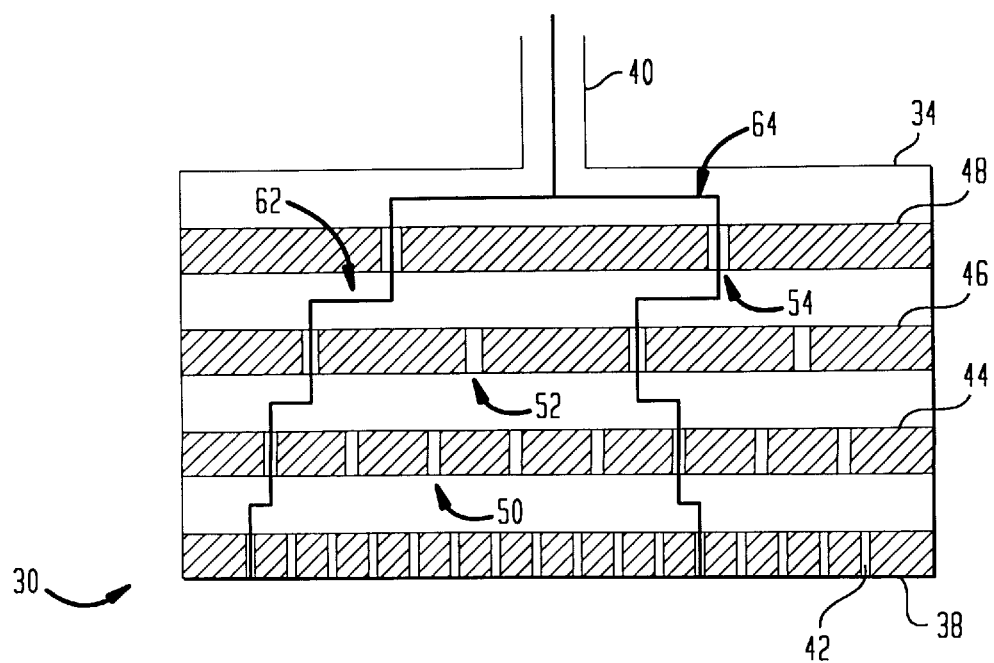
FIG. 10 is a schematic diagram of the dispenser portion showing two different paths of fluid flow.

Still referring to FIG. 10, assume that a positive pressure of fluid has been applied to the inlet port 40. Fluid enters the chamber 32 in a substantially downward direction toward the outlet ports 42. The third baffle plate 48 modifies the path of fluid flow by redirecting the flow through the four holes 54. Since the distance between the inlet port 40 to each hole 54 is equal, the pressure front arrives at each hole 54 at the same instant in time. The resultant pressures at the holes 54 are therefore equal and, consequently, the fluid velocity through each hole 54 is also equal.

The fluid continues flowing downwardly through holes 54 and is met by the second baffle plate 46. The fluid is again redirected through the holes 52. As before, the fluid velocity through each hole 52 is the same as the fluid velocity through any other hole 52. Next, the fluid is redirected through the holes 50 in the first baffle plate 44. Again, the fluid velocities through the holes 50 are equal. The fluid finally exits the outlet ports 42 having a homogeneous pressure distribution and a constant velocity.

Now that the principles of the invention have been explained, it will be understood that many modifications may be made. For example, chamber 32 is shown as a rectangular parallelopiped structure but it may be a cube, a cylinder or even a cone in shape (inlet port 40 would be at the apex of the cone and outlet ports 42 would be at the base of the cone).

The spacers 37 are shown as separate members which are detachably mounted on the shorter sides of each baffle plate. They are also shown as having the same height to provide equal separation distance amongst the three baffle plates 44, 46, 48, the upper wall 34 and lower wall 38. It will be understood that spacers 37 may be made integral to the baffle plates 44, 46, 48, or integral to the chamber 32. They also may be made of different heights with the constraint that the baffle plates 44, 46, 48, the upper chamber wall 34 and lower chamber wall 38 be spaced parallel to each other.

Finally, the above described embodiments of the present invention are intended to be illustrative only. For example, the number of baffle plates may vary from one embodiment to another. In the embodiment described, three baffle plates were shown, since a 16×16 array (or a 15×15 array) was desirable and the chamber had one inlet port. It will be understood that if the chamber had 4 inlet ports, only two baffle plates would be required for an embodiment having a 16×16 array of outlets. On the other hand, if a 32×32 array of outlets were required for an embodiment having one inlet port, four baffle plates would be necessary. Thus, numerous alternative structures and embodiments may be devised by those skilled in the art without departing from the spirit and scope of the following claims.

We claim:

1. A dispenser for pick up and deposit of solder balls comprising:

a chamber enclosed by an upper wall and a lower wall, said upper wall oriented parallel to said lower wall, said upper wall having a vertically bored inlet port and said lower wall having a plurality of vertically bored outlet ports for providing access to said chamber, said outlet ports geometrically arranged in a first array pattern, a controlled source of air coupled to said inlet port for directing air flow in a downward direction inside said chamber during positive pressure control and in an upward direction inside said chamber during negative pressure control, a plurality of baffle plates interposed between said upper wall and said lower wall, said baffle plates spatially separated from each other and oriented parallel to and spatially separated from said upper and lower walls, and each of said baffle plates having a plurality of vertically bored holes geometrically arranged in an array pattern for modifying the direction of said air flow between said inlet port and said outlet ports, whereby said dispenser is effective in providing uniform negative pressure at said outlet ports during pick up of solder balls and uniform positive pressure at said outlet ports during deposit of said solder balls.

2. The dispenser of claim 1, wherein said first array pattern is characterized by equidistantly spaced rows and columns of bores, having a first baffle plate positioned immediately above said lower wall, said first baffle plate having first holes arranged in a second array pattern formed by the placement of each one of said first holes immediately above a center of a square formed by each of four adjacent outlet ports.

3. The dispenser of claim 2, wherein a second of said baffle plates is positioned immediately above said first baffle plate, said second baffle plate having second holes arranged in a third array pattern formed by the placement of each one of said second holes immediately above a center of a square formed by each of four adjacent first holes.

4. The dispenser of claim 3, wherein a third of said baffle plates is positioned immediately above said second baffle plate, said third baffle plate having third holes arranged in a fourth array pattern formed by the placement of each one of said third holes immediately above a center of a square formed by each of four adjacent second holes.

5. The dispenser of claim 4, wherein said inlet port is positioned immediately above and centered about said third baffle plate.

6. The dispenser of claim 5, wherein said outlet ports have a predetermined diameter size, said first holes having a diameter size slightly larger than said predetermined diameter size, said second holes having a diameter size slightly larger than the diameter size of said first holes, and said third holes having a diameter size slightly larger than the diameter size of said second holes.

7. The dispenser of claim 6, wherein said first array pattern consists of 16 rows and 16 columns of outlet ports, said second array pattern consists of 8 rows and 8 columns of first holes, said third array pattern consists of 4 rows and 4 columns of second holes, and said fourth array pattern consists of 2 rows and 2 columns of third holes.

8. The dispenser of claim 6, wherein said first array pattern consists of 16 rows and 16 columns of outlet ports characterized by 15 rows and 15 columns of real outlet ports and a last row and a last column of phantom outlet ports, said second array pattern consists of 8 rows and 8 columns of first holes, said third array pattern consists of 4 rows and 4 columns of second holes, and said fourth array pattern consists of 2 rows and 2 columns of third holes.

* * * * *